(12) United States Patent
Kris et al.

(10) Patent No.: US 7,804,379 B2
(45) Date of Patent: Sep. 28, 2010

(54) PULSE WIDTH MODULATION DEAD TIME COMPENSATION METHOD AND APPARATUS

(75) Inventors: Bryan Kris, Phoenix, AZ (US); Stephen Bowling, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 274 days.

(21) Appl. No.: 12/116,468

(22) Filed: May 7, 2008

(65) Prior Publication Data

US 2009/0278621 A1 Nov. 12, 2009

(51) Int. Cl.
*H02M 1/12* (2006.01)
*H02M 3/335* (2006.01)
*H03K 7/08* (2006.01)

(52) U.S. Cl. .................. 332/109; 332/110; 363/26; 363/41

(58) Field of Classification Search ......... 332/109–111; 363/26, 41
See application file for complete search history.

(56) References Cited

U.S. PATENT DOCUMENTS

| | | | |
|---|---|---|---|
| 4,546,422 A * | 10/1985 | Okado | 363/41 |
| 4,597,037 A * | 6/1986 | Okado | 363/41 |
| 5,764,024 A | 6/1998 | Wilson | |
| 6,940,249 B2 | 9/2005 | Toyoda | |
| 7,102,322 B2 | 9/2006 | Suzuki | |
| 7,286,375 B1 | 10/2007 | Welchko et al. | |
| 2002/0184469 A1 | 12/2002 | Bowling | |
| 2007/0285951 A1 | 12/2007 | Bien | |

FOREIGN PATENT DOCUMENTS

| | | |
|---|---|---|
| EP | 1634797 A2 | 3/2006 |
| WO | 2006/023427 A2 | 3/2006 |

OTHER PUBLICATIONS

"The Analysis and Compensation of Dead-Time Effects in PWM Inverters", Seung-Gi Jeong, et al., IEEE Transactions on Industrial Electronics, IEEE Service Center, vol. 38, No. 2; pp. 108-114, Apr. 1, 1991.
International Search Report and Written Opinion, PCT/US2009/042974, 18 pages, Jul. 31, 2009.

\* cited by examiner

*Primary Examiner*—David Mis
(74) *Attorney, Agent, or Firm*—King & Spalding L.L.P.

(57) ABSTRACT

Dead time compensated complementary pulse width modulation (PWM) signals are derived from a PWM generator by first applying time period compensation to the PWM generator signal based upon the direction of current flow in an inductive load being controlled by the PWM generator. Dead time is then applied to the compensated PWM generator signal for producing complementary dead time compensated PWM signals for controlling power switching circuits driving the inductive load.

3 Claims, 5 Drawing Sheets

(a)

(b)

(Prior Technology)

PULSE WIDTH MODULATION DEAD TIME COMPENSATION METHOD AND APPARATUS

TECHNICAL FIELD

The present disclosure relates to digital devices having digital pulse width modulation (PWM) capabilities, and more particularly, to digital devices having dead time compensation of the PWM waveforms when controlling inductive loads such as motors.

BACKGROUND

Pulse width modulation (PWM) controllers are effectively being used to control voltage levels in power supplies and to control rotational speed and direction of motors. For motor control, a direct current (DC) power source is switched on and off at various rates to produce an alternating current (AC) waveform that is used to control the speed and rotational direction of the motor. Referring to FIG. 1, depicted is a schematic block diagram of a pulse width modulation (PWM) power controller 102 and a schematic connection diagram of a power driver circuit 106. Typically a "half-bridge" power transistor configuration (power transistors 110 and 112), e.g., power MOSFET, SCR, triac, etc., are controlled by two complementary PWM signals, PWMH 220 and PWML 222, only one of which is on at any time. To insure that there can be no "on" overlap of the two complementary PWM signals, "dead time" is introduced between these two complementary PWM signals, PWMH 220 and PWML 222 (generally refer to FIG. 2). The "dead time" function insures that no current spikes are generated when one transistor is turned off while the other transistor is turned on (e.g., no "on" overlap that would cause a short circuit between +V and −V). While dead-time circuits are a required function, they create their own "issues." The biggest problem with dead-time circuits is that the resultant transistor waveforms are distorted by the inductance of the motor windings. This waveform distortion causes the controlled motor to run roughly at slow motor speeds. A dead-time compensation circuit may be used to correct for the distortion caused by the motor induction.

Referring to FIG. 3, depicted are schematic block diagrams of specific example prior technology embodiments of digital PWM generation systems for generating complementary PWM waveforms having dead time compensation. These prior technologies for dead-time compensation select between two different PWM duty cycles depending on the direction of current flow in the motor load. As shown in FIG. 3(*a*), a simple dead time compensation circuit uses a multiplexer 306 to select one of two duty cycle values from different duty cycle control registers 302 and 304, depending on the state of a device input 340 (determined by direction of motor current flow). This prior technology embodiment requires a large amount of software "overhead" to constantly compute and load new duty cycle values into the device's duty cycle control registers 302 and 304. As shown in FIG. 3(*b*), another technology uses a "brute force" method that requires a hardware adder/subtractor 310 that automatically computes the desired compensated dead time values based upon the direction of current flow through the controlled motor and adds/subtracts from the duty values stored in the duty cycle control registers 302 and 304. The hardware implementation of FIG. 3(*b*) is expensive and complex to implement.

SUMMARY

Therefore a need exists for a simple, cost effective and efficient way to implement dead time compensation of complementary PWM signals that are appropriate for both directions of load current flow, e.g., the load may be a motor or any other type of inductive load.

Therefore according to teachings of this disclosure, dead time compensated complementary pulse width modulation (PWM) signals are derived from a PWM generator by first applying time period compensation to the PWM generator signal based upon the direction of current flow in an inductive load being controlled by the PWM generator. Dead time is then applied to the compensated PWM generator signal for producing complementary dead time compensated PWM signals for controlling power switching circuits driving the inductive load.

According to another specific example embodiment of this disclosure, a method of providing dead time compensation to a pulse width modulation (PWM) signal and generating complementary PWM signals therefrom comprises the steps of: compensating time periods of a pulse width modulation (PWM) signal, wherein the step of compensating the time periods of the PWM comprises the steps of: stretching the time periods of the PWM signal if a current of an inductive load is flowing in a first direction; or shrinking the time periods of the PWM signal if the current of the inductive load is flowing in a second direction; adding dead times to the compensated time periods of the PWM signal; and generating complementary PWM signals from the dead time compensated PWM signal.

According to another specific example embodiment of this disclosure, an apparatus for providing dead time compensation to a pulse width modulation (PWM) signal and generating complementary PWM signals therefrom comprises: a first circuit for compensating time periods of a pulse width modulation (PWM) signal, wherein the time periods are stretched when an inductive load current is flowing in a first direction and shrunk when the inductive load current is flowing in a second direction; a second circuit for adding dead times to the compensated time periods of the PWM signal; and a third circuit for generating complementary PWM signals from the dead time compensated PWM signal.

According to yet another specific example embodiment of this disclosure, an apparatus for providing dead time compensation to a pulse width modulation (PWM) signal and generating complementary PWM signals therefrom comprises: a first delay circuit (402) for delaying a PWM signal (450) and having an output of a delayed PWM signal (452); a first edge detector circuit (404) for generating a start signal for each logic level transition of the PWM signal (450); a first timer (406) coupled to the first edge detector circuit (404), wherein the first timer (406) generate a compensation time period each time the PWM signal (450) makes a logic level transition, the first timer (406) has a first output of a compensation time period signal (454) and a second output of a complementary compensation time period signal (456); an OR gate (408) having a first input coupled to the delayed PWM signal (452), a second input coupled to the first output of the compensation time period signal (454) and an output of a stretched PWM signal (458); an AND gate (410) having a first input coupled to the delayed PWM signal (452), a second input coupled to the second output of the complementary compensation time period signal (456) and an output of a shrunk PWM signal (460); a multiplexer (412) having a first input coupled to the stretched PWM signal (458) and a second input coupled to the shrunk PWM signal (460), wherein an output of the multiplexer (412) is coupled to the first input when a current of an inductive load is flowing in a first direction and to the second input the current of the inductive load is flowing in a second direction, whereby the output of the multiplexer (412) generates a compensated PWM signal (462); a second delay circuit (422) for delaying the compensated PWM signal (462) and having an output of a delayed compensated PWM signal (464); a second edge detector circuit (424) for generating a start signal for each logic level transition of the delayed compensated PWM signal (464); a second timer (426) coupled to the second edge detector circuit (424), wherein the second timer (426) generate a dead-time time period each time the delayed compensated PWM signal (464) makes a logic level transition, the second timer (426) has an output of a dead time compensated PWM signal (466); an AND gate (414) having a first input coupled to the compensated PWM signal (462), a second input coupled to the dead time compensated PWM signal (466) and an output of a first complementary dead time compensated PWM signal (PWMH 468); and an AND gate (416) having a first input coupled to the delayed compensated PWM signal (464), a second input coupled to the dead time compensated PWM signal (466) and an output of a second complementary dead time compensated PWM signal (PWML 470).

BRIEF DESCRIPTION OF THE DRAWINGS

A more complete understanding of the present disclosure may be acquired by referring to the following description taken in conjunction with the accompanying drawings wherein.

Figure 1:
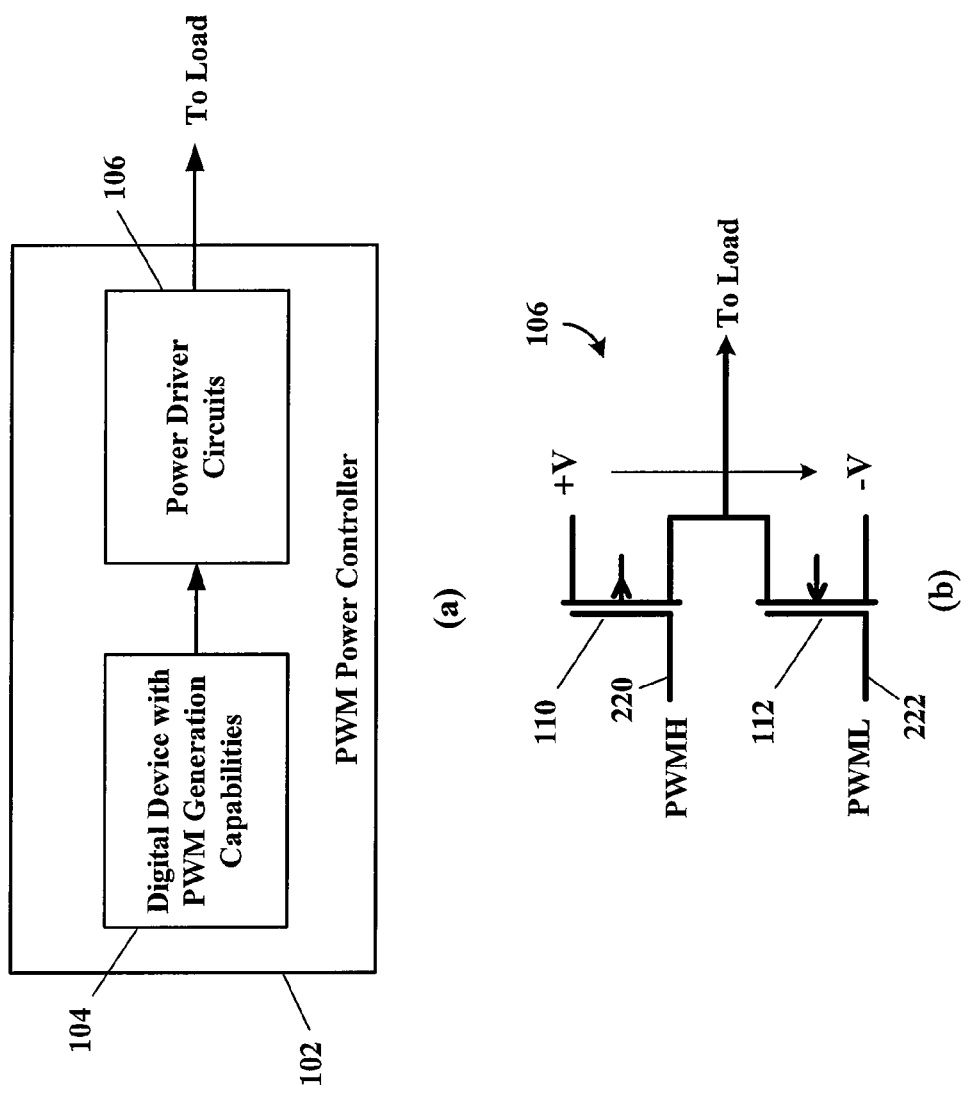
FIG. 1 illustrates a schematic block diagram of a pulse width modulation (PWM) power controller and a schematic connection diagram of a power driver circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

FIG. 1 illustrates a schematic block diagram of a pulse width modulation (PWM) power controller and a schematic connection diagram of a power driver circuit. The PWM power controller 102 may comprise a digital device 104 having complementary PWM signal generation and power driver circuits 106 used to drive a load, e.g., motor, inductive heater, etc. The power driver circuits 106 may comprise power driver transistors 110 and 112 that are used to alternately connect the load (not shown) to either +V (transistor 110 on) or −V (transistor 112 on). Both of the transistors 110 and 112 cannot be on at the same time, otherwise current shoot-through can occur which can be very destructive to the power circuits. Turning the transistors 110 and 112 on and off are controlled by the complementary PWM signals 220 and 222, respectively, from the digital device 104. The transistors 110 and 112 represent a driver circuit 106a for a single phase of an inductive load. For a multi-phase inductive load, e.g., a polyphase motor, a pair of the transistors 110 and 112 would be used for each of the phases, e.g., three phases.

Figure 2:
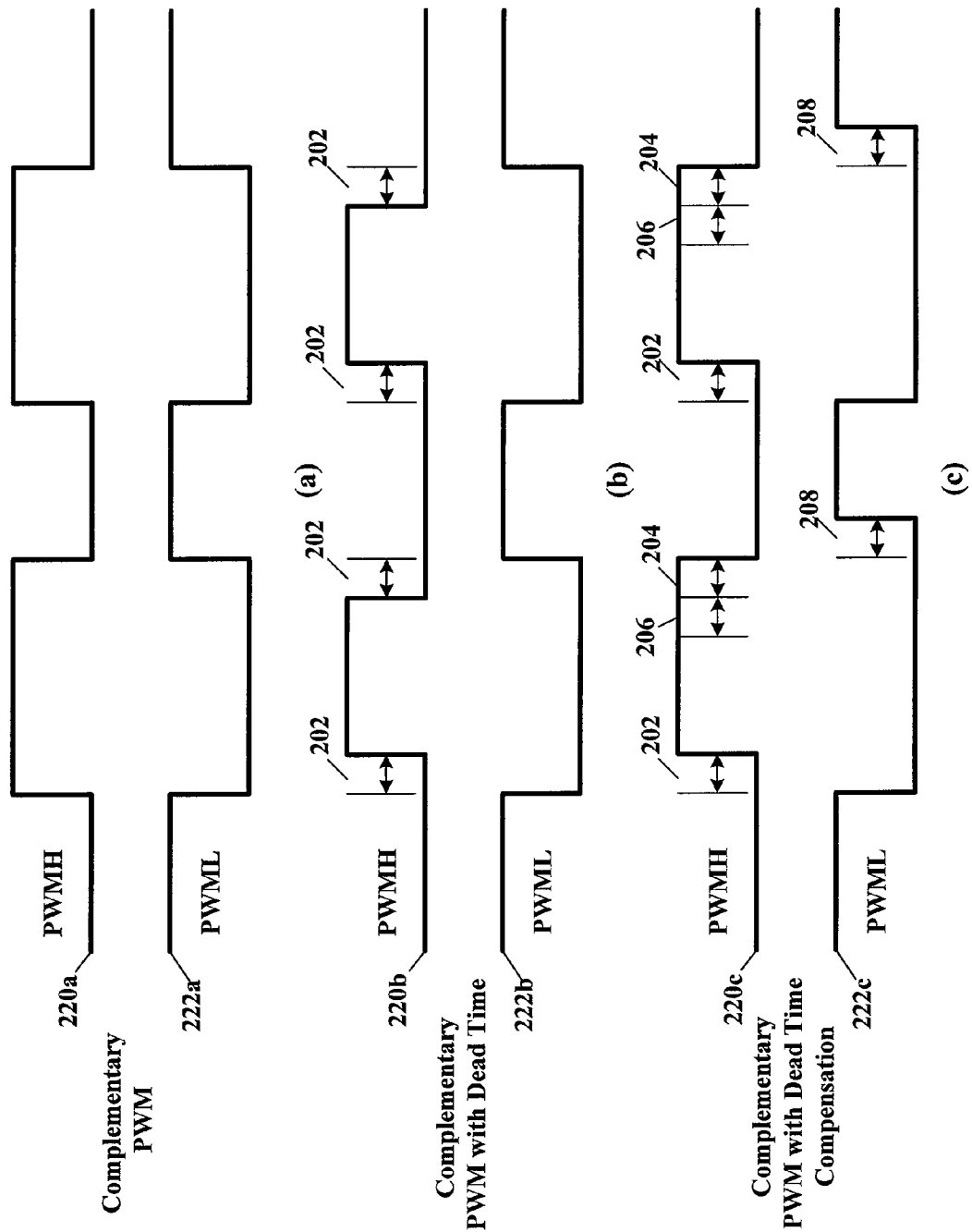
FIG. 2 illustrates timing diagrams for (a) complementary PWM waveforms, (b) complementary PWM waveforms having dead time between the PWM and complementary PWM waveforms, and (c) complementary PWM waveforms having dead time compensation.
Figure 3:
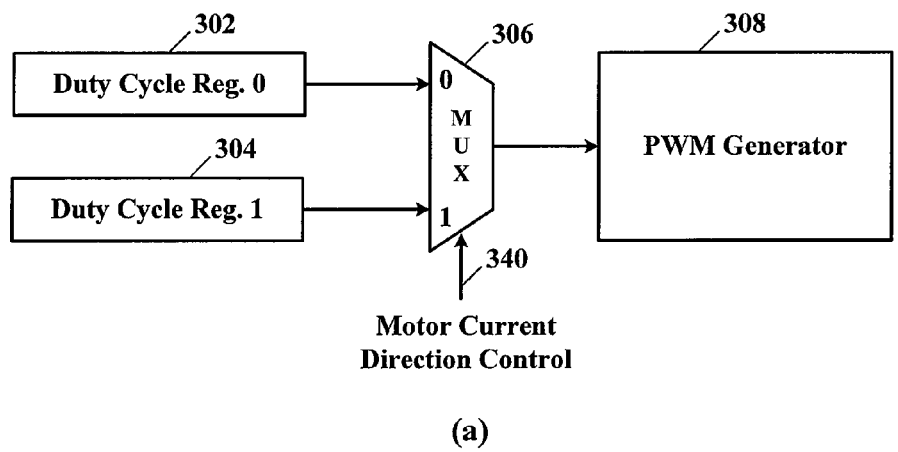
FIG. 3 illustrates schematic block diagrams of prior technology digital PWM generation systems for generating complementary PWM waveforms having dead time compensation.
Figure 3:
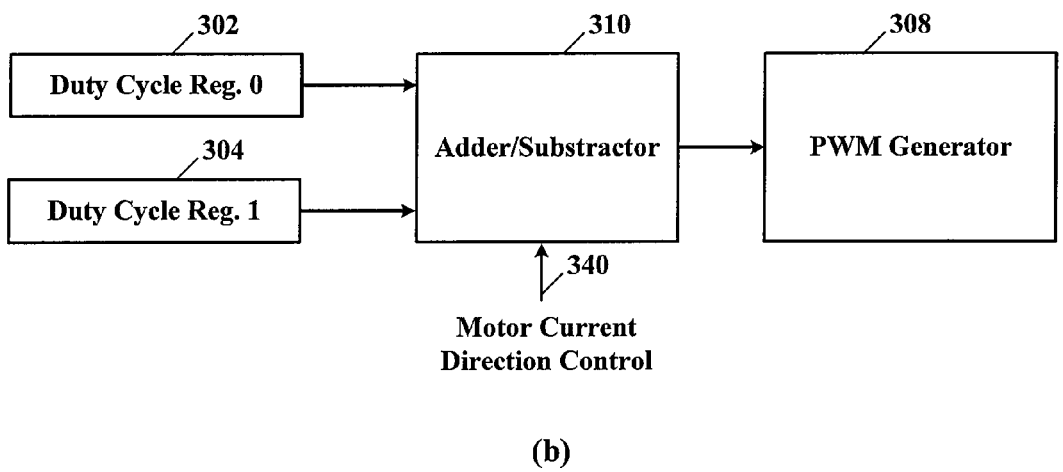

Referring to FIG. 2, depicted are timing diagrams for (a) complementary PWM waveforms, (b) complementary PWM waveforms having dead time between the PWM and complementary PWM waveforms, and (c) complementary PWM waveforms having dead time compensation. The PWML waveform signal 222a will be at a logic level low ("0"), e.g., controlling transistor 112 off, and the PWMH waveform signal 220a is at a logic level high ("1"), e.g., controlling transistor 112 on, and visa-versa. Therefore, these two signals 220a and 222a are "complementary" or "inverse" to each other so as to insure that only one of the transistors 110 and 112 is on at a time.

To further guarantee that only one of the transistors 110 and 112 is on at a time, dead times 202 are introduced to at least one of the PWM waveform signals 220b and 222b. The dead times 202 effectively prevent current shoot-through occurring as one of the transistors 110 or 112 turns on and the other turns off, similar to a break before make switch. However, introducing dead times 202 creates voltage and current distortion of the power to the motor. This is because motors are inductive and therefore current continues to flow in the motor windings during the dead-time period. Thus the applied voltage to the motor is distorted, causing current distortion in the motor. This undesirable current distortion in the motor may be compensated for by pre-distorting the PWM waveforms depending upon the motor current direction. Pre-distortion of the PWM waveforms may be accomplished by stretching one of the PWM waveform signals, e.g., PWM waveform signal 222c, represented by the numeral 208, and shrinking the other one, e.g., times 204 and 206 of PWM waveform signal 220c, as more fully described herein.

Figure 4:
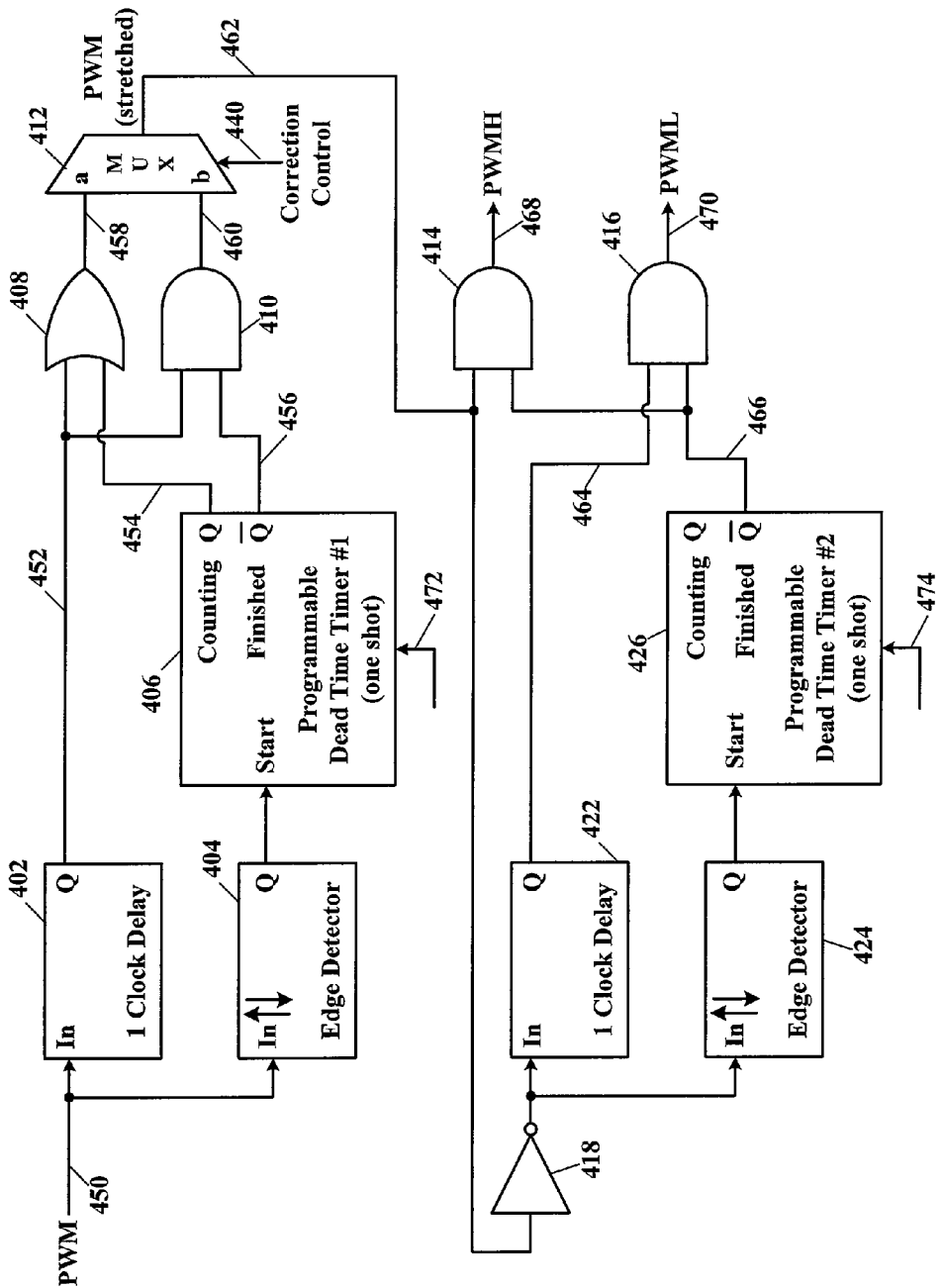
FIG. 4 illustrates a schematic block diagram of a digital PWM generator for generating complementary PWM waveforms having dead time compensation, according to a specific example embodiment of this disclosure.
Figure 5:
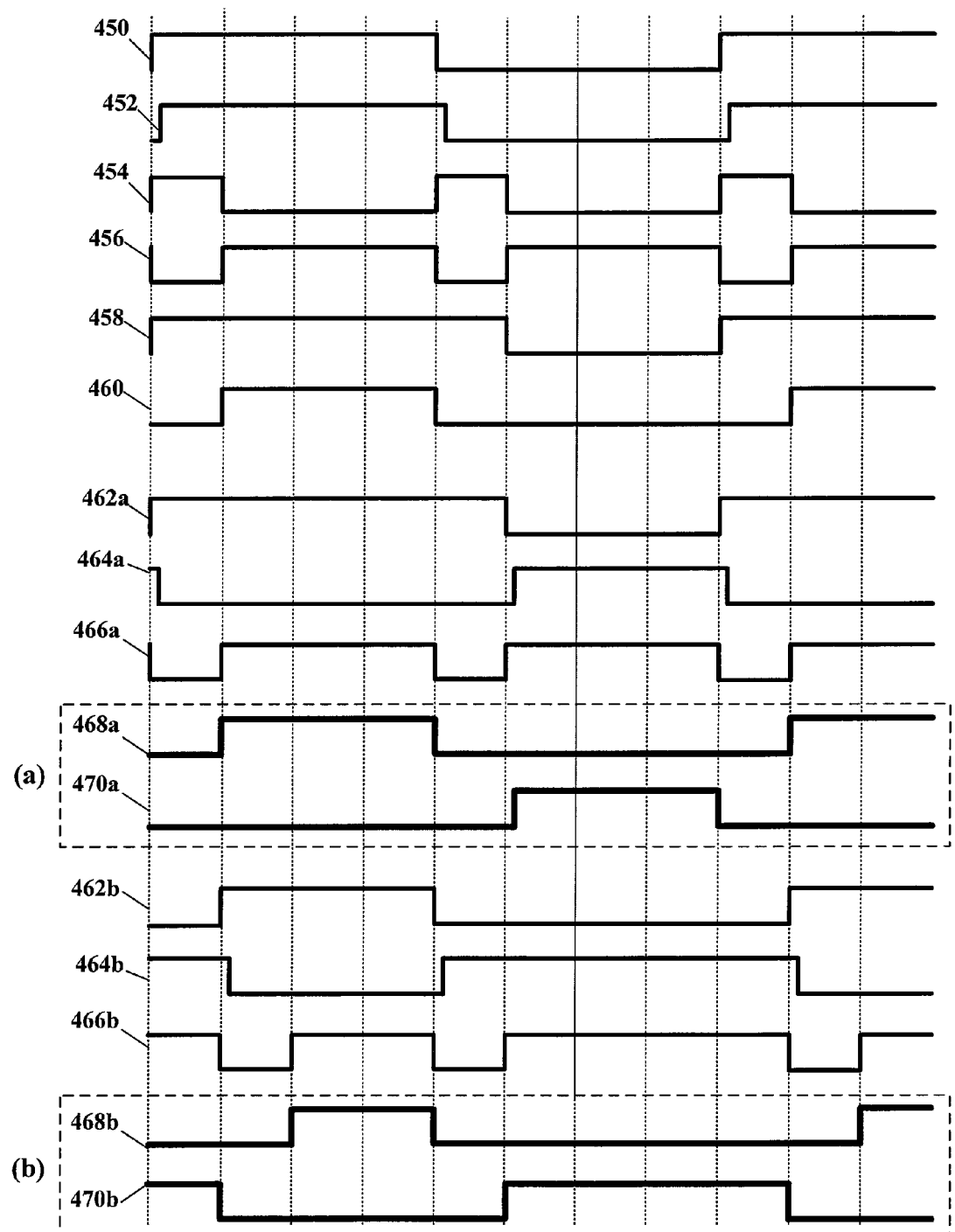
FIG. 5 illustrates schematic timing diagrams of signal waveforms generated during operation of the PWM generator shown in FIG. 4.

Referring now to FIGS. 4 and 5, wherein FIG. 4 depicts a schematic block diagram of a digital PWM generator for generating complementary PWM waveforms having dead time compensation, according to a specific example embodiment of this disclosure, and FIG. 5 depicts schematic timing diagrams of signal waveforms generated during operation of the PWM generator shown in FIG. 4. According to the teachings of this disclosure as applied to the specific example embodiment of FIG. 4, the PWM signal 462 is a "pre-distorted" version of the PWM signal 450, and the PWMH signal 468 and PWML signal 470 comprise complementary pre-distorted with dead time (blanking) signals of the original PWM signal 450, as more fully described hereinafter. One of ordinary skill in the art of digital circuit design and having the benefit of this disclosure could design other logic circuit configurations that would still be within the spirit and scope of this disclosure.

A PWM signal 450 from the PWM generator (e.g., part of the digital device 104) is applied concurrently to the inputs of a one clock delay circuit (register) 402 and an edge detector 404. The one clock delay circuit 402 delays the PWM signal 450 by one clock time period to produce a delayed PWM signal 452 which is a replica of the PWM signal 450 that has been delayed by one clock period. Whenever the edge detector 404 detects a logic level transition, e.g., low-to-high or high-to-low, the Q output of the edge detector 404 will start a dead time compensation timer 406, e.g., a one-shot timer. The on-time duration of the dead time timer 406 may be programmable through digital input 472 to provide a desired amount of dead-time compensation, e.g., 204 and 206, (see FIG. 2). Upon receiving this start signal from the edge detector 404, the dead time timer 406 produces a logic high ("1") on its Q-output and a logic low ("0") on its Q/not-output, as timing signals 454 and 456, respectively. The delayed PWM signal 452 is logically or'ed with the timing signal 454 in OR gate 408 to produce a "stretched" PWM signal 458. The delayed PWM signal 452 is logically and'ed with the timing signal 456 in AND gate 410 to produce a "shortened" PWM signal 460. The one clock period time delay of the delayed PWM signal 452 insures that the PWM signal 452 and the output timing signals 454 and 456 arrive at the proper times to the inputs of the OR gate 408 and the AND gate 410, respectively.

A multiplexer 412 selects, depending on the correction input signal 440 logic level, either the "stretched" PWM signal 458 on input a, or the "shortened" PWM signal 460 on input b to produce a stretched or shortened PWM signal 462, respectively. The correction input signal 440 logic level is determined by the direction of current flow in the motor. The stretched or shortened PWM signal 462 is then sent to inputs of the AND gate 414 and the inverter 418. An output from the inverter 418 is applied concurrently to the inputs of a one clock delay circuit (register) 422 and an edge detector 424. The one clock delay circuit 422 delays the PWM signal from the inverter 418 one clock time period to produce a delayed PWM signal 464 which is an inverted replica of the stretched or shortened PWM signal 462 that has been delayed by one clock period. The stretched or shortened PWM signal 462 is the "pre-distorted" version of the original PWM signal 450 prior to the application of a standard dead-time blanking function, as discussed more fully hereinafter.

Whenever the edge detector 424 detects a logic level transition, e.g., low-to-high or high-to-low, the Q output of the edge detector 424 will start a dead time timer 426, e.g., a one-shot timer. The on-time duration of the dead timer 426 may be programmable through digital input 474 to provide the desired dead time 202 (see FIG. 2). Upon receiving this start signal from the edge detector 424, the dead time timer 426 produces a logic low ("0") on its Q/not-output, as timing signal 466. The stretched or shortened PWM signal 462 is logically and'ed with the timing signal 466 in AND gate 414 to produce a compensated dead time PWMH signal 468. The delayed PWM signal 464 is logically and'ed with the timing signal 466 in AND gate 416 to produce a compensated dead time PWML signal 470. The one clock period delay of the delayed PWM signal 464 insures that the PWM signal 464 and the output timing signal 466 arrive at the proper times to the inputs of the AND gate 416. The dead-time 202 is thereby integrated with the stretched or shortened (compensated) PWM 462 signal to produce the PWMH output signal 468, and the PWML output signal 470.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for providing dead time compensation to a pulse width modulation (PWM) signal and generating complementary PWM signals therefrom, said apparatus comprising:
    a first delay circuit for delaying a PWM signal and having an output of a delayed PWM signal;
    a first edge detector circuit for generating a start signal for each logic level transition of the PWM signal;
    a first timer coupled to the first edge detector circuit, wherein the first timer generate a compensation time period each time the PWM signal makes a logic level transition, the first timer has a first output of a compensation time period signal and a second output of a complementary compensation time period signal;
    an OR gate having a first input coupled to the delayed PWM signal, a second input coupled to the first output of the compensation time period signal and an output of a stretched PWM signal;
    an AND gate having a first input coupled to the delayed PWM signal, a second input coupled to the second output of the complementary compensation time period signal and an output of a shrunk PWM signal;
    a multiplexer having a first input coupled to the stretched PWM signal and a second input coupled to the shrunk PWM signal, wherein an output of the multiplexer is coupled to the first input when a current of an inductive load is flowing in a first direction and to the second input the current of the inductive load is flowing in a second direction, whereby the output of the multiplexer generates a compensated PWM signal;
    a second delay circuit for delaying the compensated PWM signal and having an output of a delayed compensated PWM signal;
    a second edge detector circuit for generating a start signal for each logic level transition of the delayed compensated PWM signal;
    a second timer coupled to the second edge detector circuit, wherein the second timer generate a dead-time time period each time the delayed compensated PWM signal makes a logic level transition, the second timer has an output of a dead time compensated PWM signal;
    an AND gate having a first input coupled to the compensated PWM signal, a second input coupled to the dead time compensated PWM signal and an output of a first complementary dead time compensated PWM signal (PWMH); and
    an AND gate having a first input coupled to the delayed compensated PWM signal, a second input coupled to the dead time compensated PWM signal and an output of a second complementary dead time compensated PWM signal (PWML).

2. The apparatus according to claim 1, wherein the first timer is programmable.

3. The apparatus according to claim 1, wherein the second timer is programmable.

* * * * *